United States Patent
Zhang et al.

(10) Patent No.: US 7,655,514 B2
(45) Date of Patent: Feb. 2, 2010

(54) METHOD OF FABRICATING A MESFET WITH A SLOPED MESA STRUCTURE

(75) Inventors: An-Ping Zhang, Niskayuna, NY (US); Larry B. Rowland, Scotia, NY (US); James W. Kretchmer, Ballston Spa, NY (US); Jesse Tucker, Niskayuna, NY (US); Edmund B. Kaminsky, Rexford, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/001,806

(22) Filed: Dec. 13, 2007

(65) Prior Publication Data

US 2008/0096335 A1    Apr. 24, 2008

Related U.S. Application Data (62) Division of application No. 10/930,584, filed on Aug. 31, 2004, now Pat. No. 7,345,309.

(51) Int. Cl.
*H01L 21/338* (2006.01)

(52) U.S. Cl. .................. 438/167; 438/182; 438/412; 438/574; 438/713; 257/E21.037; 257/E21.054; 257/E21.45; 257/E21.605

(58) Field of Classification Search ......... 438/167–185, 438/701, 636, 713, 717, 758–760, 778, 787, 438/791, 952, 39, 40, 42, 43, FOR. 198, 164, 438/574, 579, 602, 712, 977, 412, 572, 978, 438/736–738; 257/E21.45–E21.455, E29.265, 257/E29.32, 77, E21.026, E21.036, E21.037, 257/E21.038, E21.054, E21.06, E21.064, 257/E21.065, E21.605, E21.618, E21.633, 257/280–284, E29.321, E29.246–E29.25, 257/E21.403, E21.407

See application file for complete search history.

(56) References Cited

U.S. PATENT DOCUMENTS

| | | | |
|---|---|---|---|
| 5,043,776 A | | 8/1991 | Hida |
| 5,174,857 A | * | 12/1992 | Sung ............................ 216/48 |
| 5,260,230 A | * | 11/1993 | Kondo ......................... 438/40 |
| 5,510,630 A | | 4/1996 | Agarwal et al. |
| 5,728,259 A | * | 3/1998 | Suzawa et al. .............. 438/164 |
| 5,838,706 A | * | 11/1998 | Edmond et al. ........ 372/45.011 |
| 5,893,757 A | * | 4/1999 | Su et al. ...................... 438/713 |
| 5,925,895 A | | 7/1999 | Sriram et al. |
| 5,933,749 A | * | 8/1999 | Lee .............................. 438/435 |
| 6,121,633 A | * | 9/2000 | Singh et al. .................... 257/77 |
| 6,465,289 B1 | * | 10/2002 | Streit et al. ................. 438/167 |
| 6,512,783 B1 | * | 1/2003 | Yamamoto et al. ........ 372/45.01 |
| 6,686,616 B1 | | 2/2004 | Allen et al. |
| 7,112,478 B2 | * | 9/2006 | Grupp et al. ................. 438/197 |
| 7,160,747 B2 | * | 1/2007 | Haberern et al. .............. 438/39 |

(Continued)

*Primary Examiner*—Matthew C Landau
*Assistant Examiner*—Joseph C Nicely
(74) *Attorney, Agent, or Firm*—Howard IP Law Group, PC (57) ABSTRACT

A silicon carbide metal semiconductor field-effect transistor includes a bi-layer silicon carbide buffer for improving electron confinement in the channel region and/or a layer disposed over at least the channel region of the transistor for suppressing surface effects caused by dangling bonds and interface states. Also, a sloped MESA fabrication method which utilizes a dielectric etch mask that protects the MESA top surface during MESA processing and enables formation of sloped MESA sidewalls.

17 Claims, 12 Drawing Sheets

U.S. PATENT DOCUMENTS

| | | | |
|---|---|---|---|
| 7,361,536 B2 * | 4/2008 | Hwang ........................ 438/167 |
| 2002/0034204 A1 * | 3/2002 | Iwamoto et al. ............... 372/46 |
| 2003/0075719 A1 | 4/2003 | Sriram |
| 2003/0151063 A1 * | 8/2003 | Kobayashi ................... 257/192 |
| 2004/0099888 A1 * | 5/2004 | Sriram ........................ 257/288 |
| 2004/0253551 A1 * | 12/2004 | Shibata et al. ............... 430/330 |
| 2006/0226442 A1 * | 10/2006 | Zhang et al. ................. 257/192 |
| 2007/0091957 A1 * | 4/2007 | Watatani .................... 372/46.01 |
| 2008/0124851 A1 * | 5/2008 | Zhang et al. ................. 438/172 |

\* cited by examiner

METHOD OF FABRICATING A MESFET WITH A SLOPED MESA STRUCTURE

CROSS REFERENCE TO RELATED APPLICATION

This application is a divisional application of U.S. patent application Ser. No. 10/930,584, entitled SIC METAL SEMICONDUCTOR FIELD-EFFECT TRANSISTORS AND METHODS FOR PRODUCING SAME, filed on Aug. 31, 2004 now U.S. Pat. No. 7,345,309, the entire disclosure of which is hereby incorporated as if being set forth in its entirety herein.

FIELD OF INVENTION

The present invention relates to silicon carbide semiconductor devices and more particularly, to microwave power silicon carbide-based metal semiconductor field effect transistors and methods for producing such transistors.

BACKGROUND

Power semiconductor devices fabricated from monocrystalline silicon carbide (SiC) have been widely investigated. As is well known in the art, monocrystalline SiC is particularly well suited for use in semiconductor devices, and in particular for power semiconductor devices, such as metal semiconductor field-effect transistors (MESFETs).

SiC has many characteristics which make it superior to silicon (Si) as a foundation material for a power semiconductor device. Specifically, SiC has a wider bandgap, a higher melting point, a lower dielectric constant, a higher breakdown field strength, a higher thermal conductivity and a higher saturation electron drift velocity than Si. These characteristics suggest that SiC-based power devices would operate at higher temperatures, higher power levels and with lower specific on-resistance than conventional Si-based power devices.

Although SiC is an excellent foundation material for power MESFET transistors, substrate material defects such as bulk crystal dislocations and dangling bonds at the material surface result in deep level and surface electron trapping effects that significantly limit the power performance and SiC MESFET reliability. Conventional SiC-based MESFETs exhibit high output conductance induced by poor carrier confinement in the channel region that enhances the probability of electron trapping in the buffer due to the aforementioned traps. This characteristic causes leakage current and degrades the gain and output power of SiC MESFETs.

Accordingly, a need exists for a SiC MESFET with improved electron confinement in the channel region to minimize the impact of deep level traps. In addition, the channel region surface requires an optimized passivation layer to eliminate dangling bond effects.

DETAILED DESCRIPTION

Figure 1A:
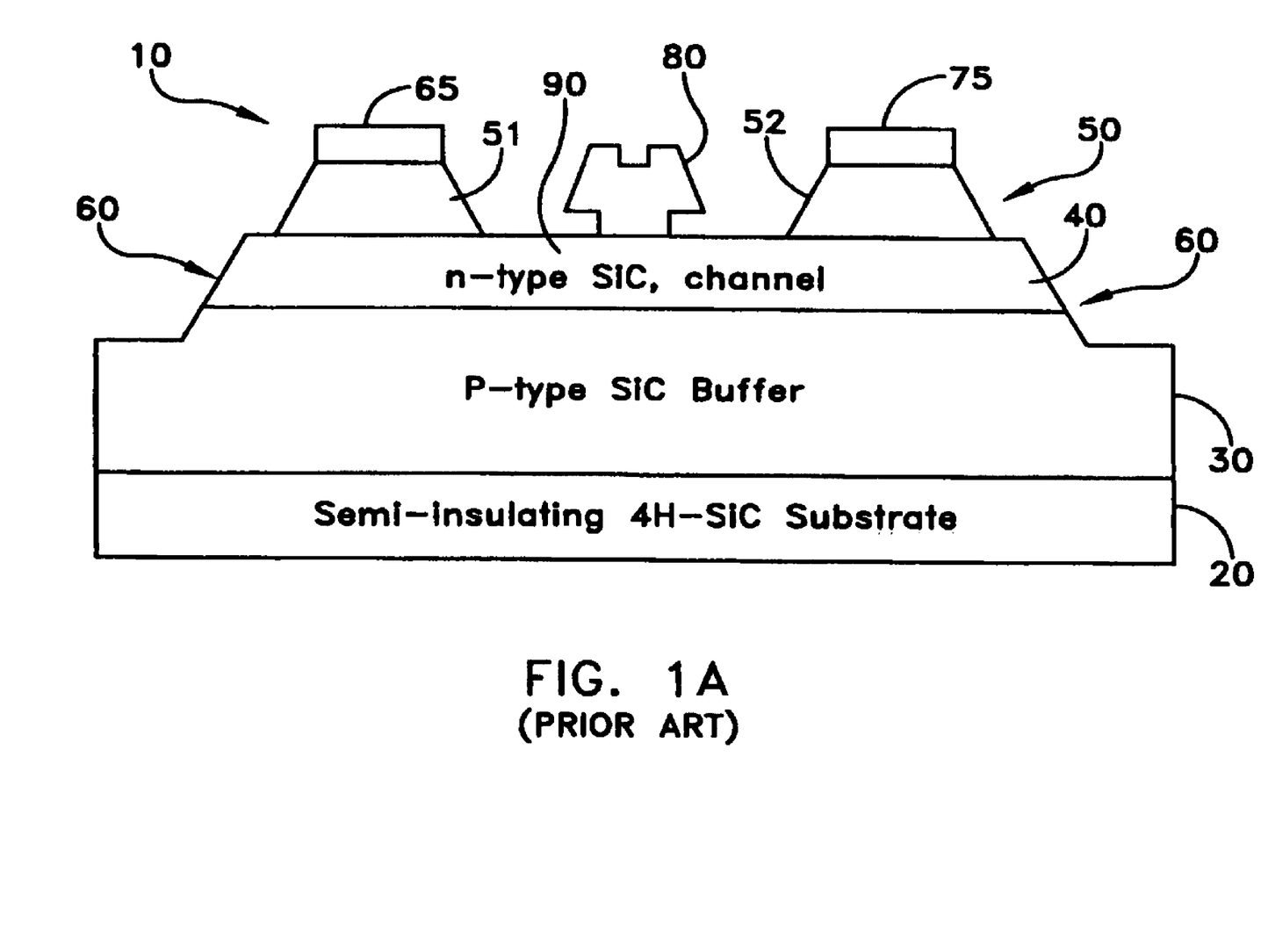
FIG. 1A illustrates a sectional view of an embodiment of a prior art silicon carbide (SiC) metal semiconductor field effect transistor (MESFET).

FIG. 1A illustrates a sectional view of an embodiment of a prior art silicon carbide (SiC) metal semiconductor field effect transistor (MESFET), denoted by reference numeral 10. The MESFET 10 is formed on a semi-insulating monocrystalline SiC substrate 20. A monocrystalline SiC buffer layer 30 of a first conductivity type, shown herein as P-type, is formed on the semi-insulating SiC substrate 20 by epitaxial growth. A monocrystalline SiC channel layer 40 of a second conductivity type opposite to the first conductivity type, shown herein as N-type, is formed on the SiC buffer layer 30 by epitaxial growth. A monocrystalline SiC Epitaxial N+ cap layer 50 is deposited by epitaxial growth. MESFET devices need to be isolated from one another. This is achieved by a lithographic patterning and dry etching to form MESAs 60 as shown in FIG. 1A. The MESA etch terminates in the p-buffer region. If MESA sidewalls are vertical, it will lower yield due to gate electrode thinning and breaks going over the MESA edge to form off MESA pad terminations. A novel approach for achieving sloped MESA sidewalls is described herein ([0033]).

Source 51 and drain 52 regions are formed by lithographic patterning and dry etching to remove the SiC N+ cap layer except for the source and drain regions. The SiC cap layer 50 provides lower resistance source drain regions and better current spreading. Ohmic contacts and overlay metal, regions 65 and 75, are formed over source 51 and drain 52 regions, respectively, by two sequential lithography, evaporated metalization (Nickel and Ti/Ni/Au respectively), and liftoff steps to further reduce contact resistance to improve current handling.

The SiC substrate 20 and SiC buffer, channel, and cap layers 30, 40, 50 respectively are preferred to be of the 4H polytype due to its favorable mobility compared to other polytypes. In one configuration, the SiC substrate is 4H polytype and semi-insulating. Conductive SiC can also be used for lower frequency operation (e.g. UHF) if a thick buffer layer is utilized (e.g. about 8 microns). The SiC buffer, channel, and cap layers 30, 40, 50 are typically formed using epitaxial techniques, such as chemical vapor deposition (CVD), that are well known to those skilled in the art. The SiC buffer layer 30 typically has an impurity doping concentration of 5E15-5E16 $cm^{-3}$ and a thickness of 0.25-0.8 microns. The SiC channel 40 layer typically has an impurity doping concentration of 2-6E17 cm$^{-3}$ a thickness of 0.15-0.35 microns. The cap layer 50 is highly doped with the second conductivity type, shown herein as N+ of a doping concentration of ~1E19 cm$^{-3}$ a thickness of 0.15-0.25 microns. The source drain regions 51 and 52 are formed from this layer using lithography and dry etch techniques.

The MESFET 10 has a gate electrode 80 formed on the channel region surface 40, between the source region 51 and drain region 52. The gate electrode 80 is formed as a T-shape structure and may be composed of any number of materials capable of forming a Schottky contact with the channel 40; typically, Nickel or Titanium, in combination with platinum and/or gold. E-Beam or stepper lithographic processes are used to form a T shaped liftoff profile mask opening and the gate metal is evaporated and liftoff is performed to define gates. The resulting T-Gate structure bottom establishes the gate length while the wider top reduces the series gate resistance of the device. Typical gate lengths range from 0.5 to 1 micron depending on the operation frequency of interest. The source electrode 65 and a drain electrode 75 may be formed as described previously for reducing contact resistance and improving current handling. A channel region is generated in the channel layer 40 between the source and drain regions 51, 52 when proper biasing voltages are applied to the MESFET 10.

Figure 1B:
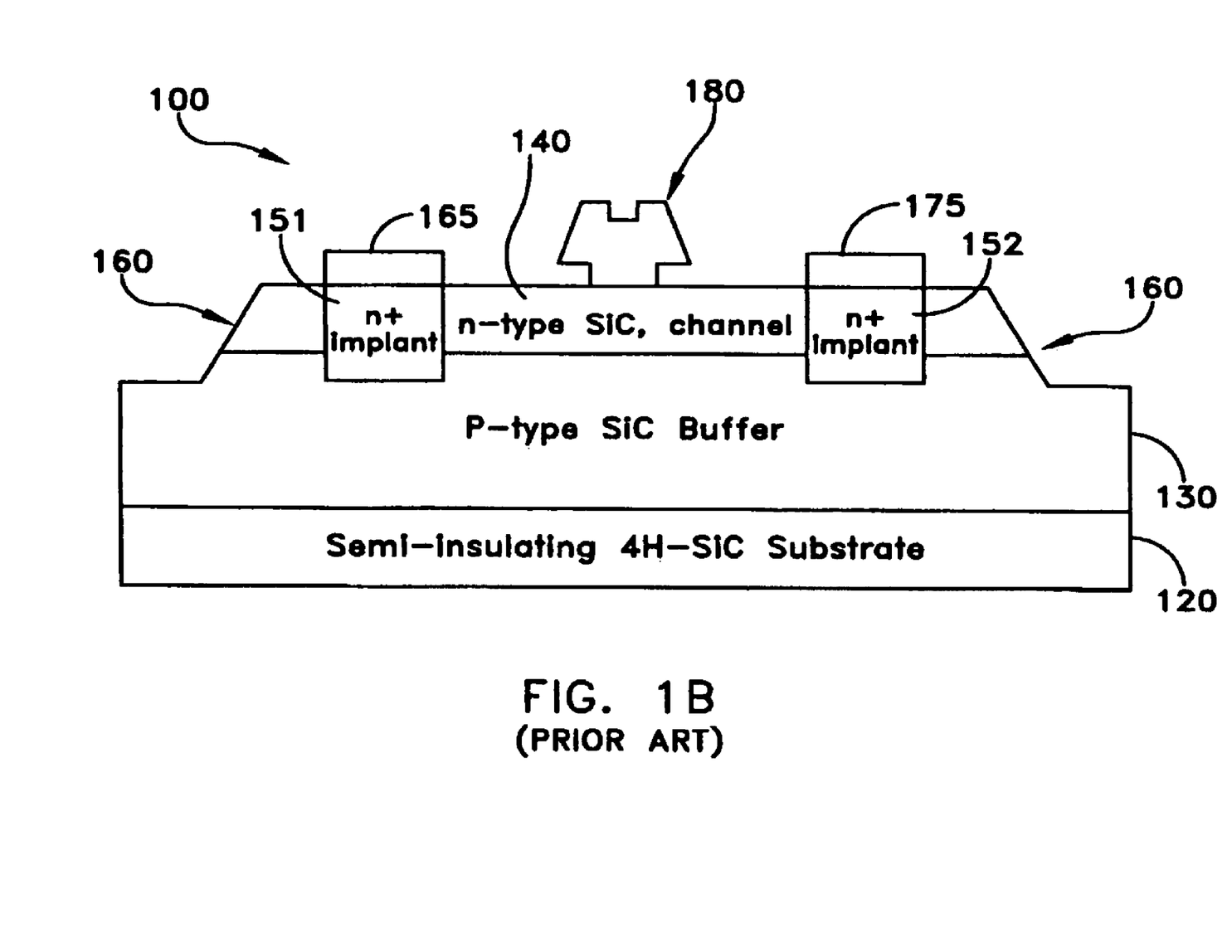
FIG. 1B illustrates a sectional view of an alternative embodiment of a prior art SiC MESFET.

FIG. 1B illustrates a sectional view of an alternative embodiment of a prior art SiC MESFET, denoted by reference numeral 100. The MESFET 100 is formed on a semi-insulating monocrystalline SiC substrate 120. A monocrystalline SiC buffer layer 130 of a first conductivity type, shown herein as P-type, is formed on the semi-insulating SiC substrate 120 by epitaxial growth. A monocrystalline SiC channel layer 140 of a second conductivity type opposite to the first conductivity type, shown herein as N-type, is formed on the SiC buffer layer 130 by epitaxial growth.

The SiC substrate 120 and SiC buffer layer 130 and channel layer 140 are preferred to be of the 4H polytype due to its favorable mobility compared to other polytypes. The SiC buffer layer 130 and channel layer 140 are typically formed using epitaxial techniques, such as chemical vapor deposition (CVD), that are well known to those skilled in the art. The SiC buffer layer 130 typically has an impurity doping concentration of 5E15-5E16 cm$^{-3}$ and a thickness of 0.25-0.8 microns. The SiC channel 140 layer typically has an impurity doping concentration of 2-6E17 cm$^{-3}$ and a thickness of 0.15-0.35 microns.

MESFET 100 is isolated by MESAs 160 fabricated as described previously with respect to FIG. 1A. Source 151 and drain 152 regions of the MESFET 100 are formed in the SiC channel layer 140 by ion implantation and partially extend into the SiC buffer layer 130. A thick oxide is deposited and lithographically patterned and etched to allow implantation in the source and drain regions while blocking implantation with thick oxide elsewhere. The source and drain regions 151 and 152 are highly doped with dopants of the second conductivity type, shown herein as N+. The doping of the source region 151 and drain region 152 may be accomplished using ion implantation of Phosphorous (P31) at 600° C.; 180 KeV 1.3E15, 90 KeV 1.1E15, and 40 KeV 8.0E14. Alternative N+ dopants such as Nitrogen can be used as well. A high temperature step is required to activate the implanted dopant. The activation temperature is typically between 1300° C. and 1500° C. Care must be taken to control the ambient gas species (Argon or SiH4) and its purity. Step bunching will result if not optimally processed. The final key to formation of implanted source drain regions is damage removal through a thin (150-300 A) wet oxidation and strip back step. The source electrode 165 and a drain electrode 175 are typically formed by sequentially forming ohmic contacts and overlay metalization to source and drain regions 151, 152 as previously described. A gate electrode 180 is also formed on the channel layer surface 140, between the source and drain electrodes 165, 175. The gate electrode 180 is formed as a T-shape structure and may be composed of any number of materials capable of forming a Schottky contact with the channel layer 140; typically, Nickel or Titanium, in combination with platinum and or gold. E-beam or stepper lithographic processes are used to form a T shaped liftoff opening and the gate metal is evaporated and liftoff performed. The resulting T-Gate structure bottom establishes the gate length while the wider top reduces the series gate resistance of the device. Typical gate lengths range from 0.5 to 1 micron depending on operation frequency of interest. A channel region is generated in the channel layer 140 between the source and drain regions 151, 152 when proper biasing voltages are applied to the MESFET 100.

Figure 2A:
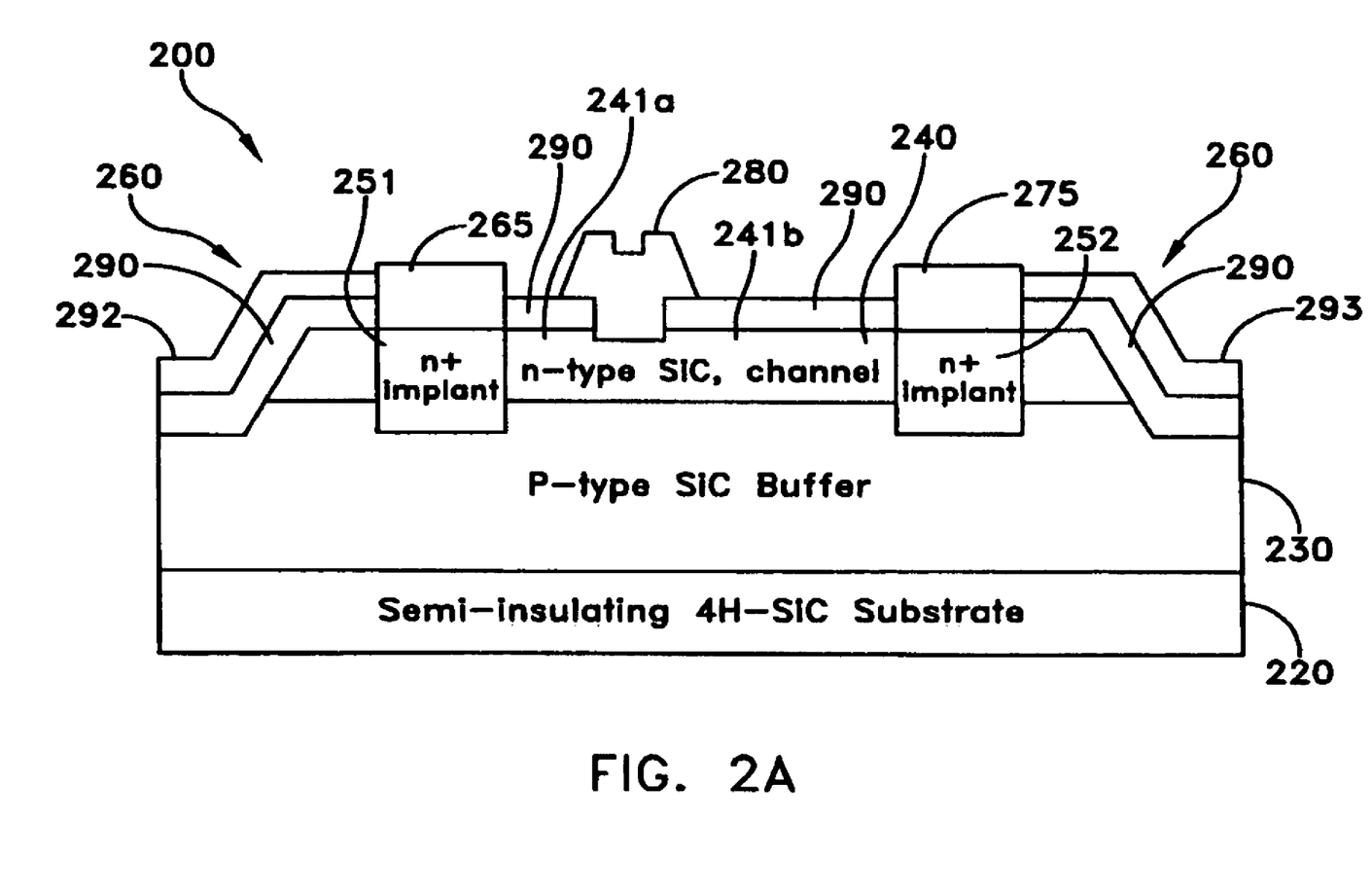
FIG. 2A illustrates a sectional view of an embodiment of a SiC MESFET according to the present invention having full coverage passivation.

FIG. 2A illustrates a sectional view of an embodiment of a SiC MESFET, according to the present invention, denoted by reference numeral 200. The basic structure of MESFET 200 is similar to MESFET 100 illustrated in FIG. 1B, however, MESFET 200 includes a dielectric passivation layer 290 over channel region 240 that enhances the reliability of the MESFET 200. Specifically, a "full coverage" surface passivation layer 290 is fabricated over the entire SiC wafer surface following MESA 260 and source 251 and drain 252 fabrication steps. Subsequent ohmic contacts/overlay metalization processing over source 251 and drain 252 to form source and drain electrodes 265 and 275 and t-gate electrode 280 require the additional process step of dielectric etch removal from lithography windows to allow subsequent metalizations to contact the SiC channel surface 240. This is easily accomplished by a combination of dry and wet etching in windows of a resist mask layer. The passivation dielectric 290 remains on the channel surface 241a extending between the gate electrode 280 and the source electrode 265, and on the channel surface 241b extending between the gate electrode 280 and the drain electrode 275. The passivation 290 also remains in off MESA regions and MESA 260 sidewalls although this can be removed if desired. The "full coverage" surface passivation layer 290 provides full coverage under the gate electrode 280 "mushroom" top. This increases the gate to source breakdown voltage of the MESFET 200 by spreading the electric field crowding around the gate electrode 280 on the drain side of the MESFET 200. The gate to drain breakdown voltage is further enhanced by offsetting the gate electrode 280 towards the source region 251 as shown in FIG. 2A. Typical spacing for a 3.5 micron channel length MESFET would be 2 microns space between the gate electrode 280 and the drain implant 252 and 1 micron between the gate electrode 280 and the source implant 251.

Figure 2B:
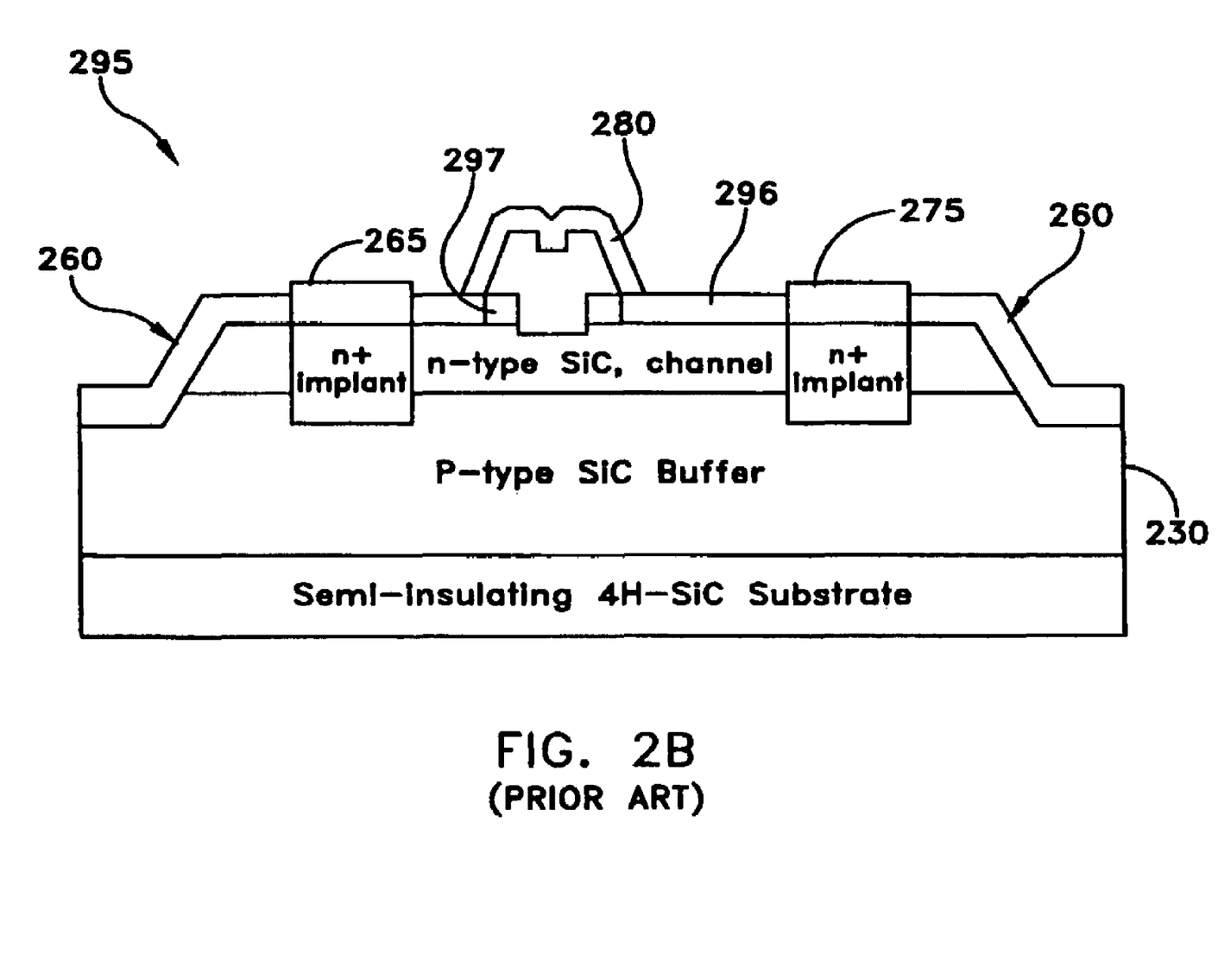
FIG. 2B illustrates a sectional view of yet another embodiment of a prior art SiC MESFET with prior art post gate passivation.
Figure 2C:
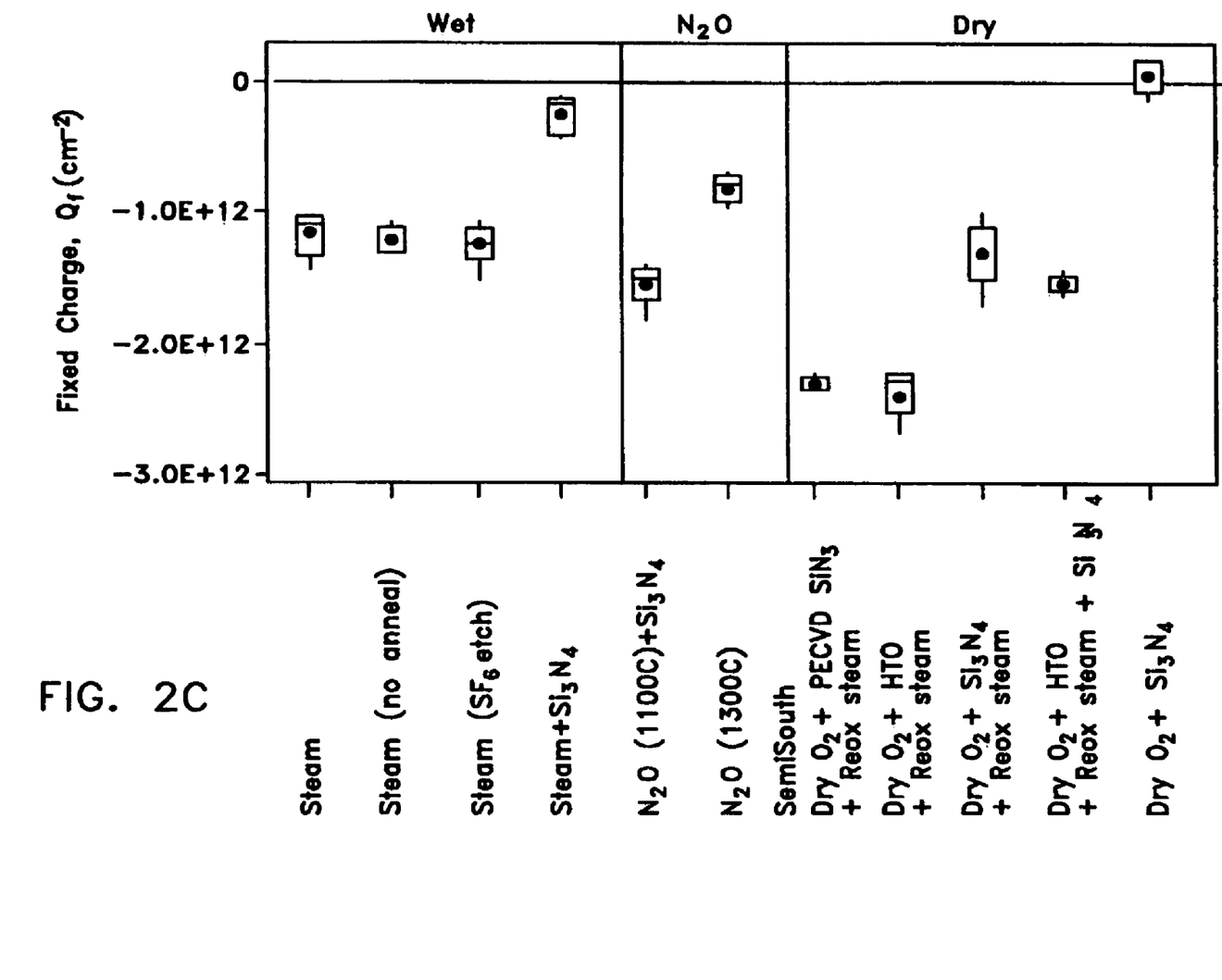
FIG. 2C is a graph illustrating fixed charge in MOS capacitors fabricated on SiC.
Figure 2D:
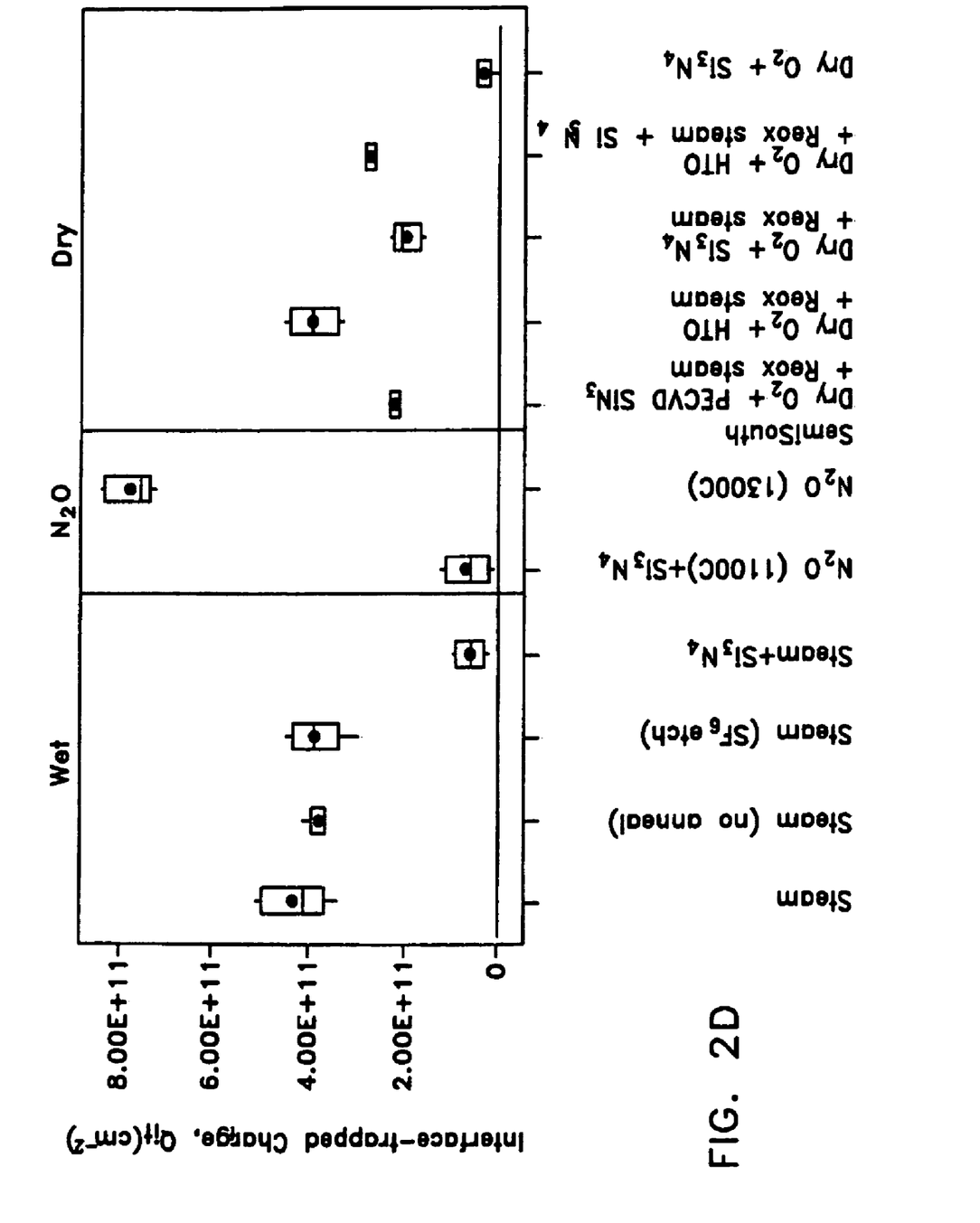
FIG. 2D is a graph illustrating interface-trapped charge in MOS capacitors fabricated on SiC.

A properly formed passivation will tie up dangling bonds on the surface of the channel. A "full coverage" passivation 290 is preferred to post gate deposited surface passivation layers due to its "full channel coverage." The prior art MESFET 295 of FIG. 2B shows that post gate deposited passivation 296 is masked from deposition under the t-gate mushroom extension 297 that results in a critical region of the channel layer surface 240 along the gate electrode being unpassivated. The inventive MESFET 200 of FIG. 2A shows that "full coverage" surface passivation 290 covers the entire channel surface region. Passivation 290 may be composed of silicon dioxide ($SiO_2$), silicon nitride ($SiN_x$), oxide-nitride, oxide-nitride-oxide (ONO) or oxide-nitride-oxide-nitride (ONON). Oxide can be deposited or thermally grown in a steam or dry O2 ambient and nitride can be deposited at low temperature (PECVD at ~380 C) or high temperature (LPCVD at ~900 C) depending on step in the process flow passivation is processed. Passivation processed prior to any metalization processing can be applied at high temperatures (>1100 C). Since the passivation structure forms a MOS capacitor at the edges of the gate electrode, it is desirable to minimize fixed charge and interface trapped charge in this region. Fixed charge and interface trapped charge for a matrix of MOS capacitors fabricated on SiC are shown in FIGS. 2C and 2D. Experimental results show that thermal oxide with LPCVD deposited nitride demonstrated the lowest levels of fixed and interface charge, with dry O2 oxidation and LPCVD nitride the preferred combination. Subsequent oxidation (ONO) demonstrated an increase in fixed and trapped charge. Oxide thickness of 150 A to 500 A in combination with LPCVD nitride thickness of 250-750 A was shown to be the preferred embodiment for the passivation structure.

Figure 3A:
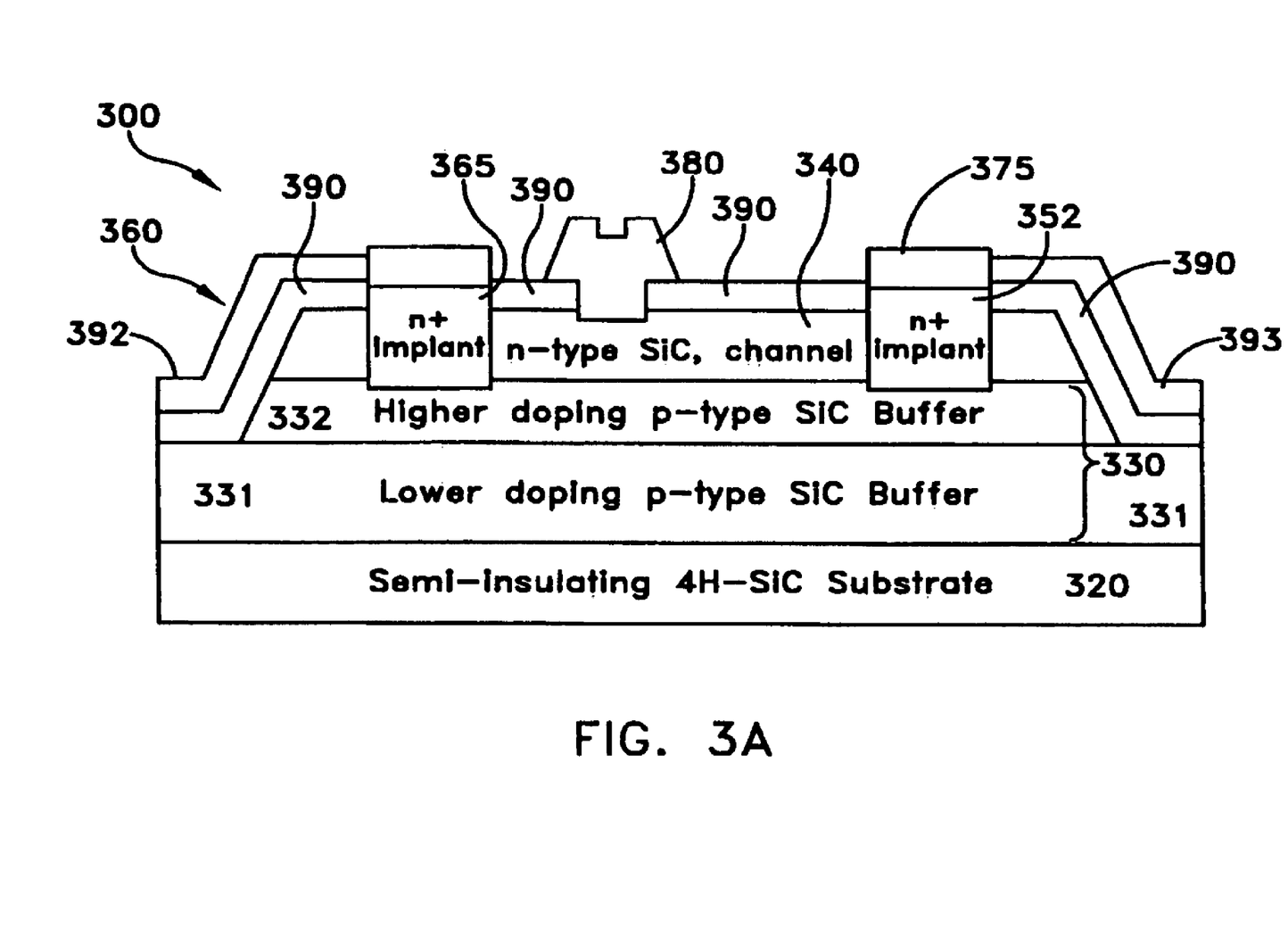
FIG. 3A illustrates a sectional view of another embodiment of a SiC MESFET according to the present invention having a current confinement optimized P-buffer.

FIG. 3A illustrates a sectional view of another embodiment of a silicon carbide MESFET according to the present invention, denoted by numeral 300. This embodiment of the MESFET 300 is similar to the MESFET illustrated in FIG. 2A, except that it includes bi-layer SiC buffer structure 330. The SiC bi-layer buffer structure 330 includes a lightly doped first monocrystalline SiC buffer layer 331 and a higher doped second monocrystalline SiC buffer layer 332, each of which is shown herein as being of a p-type conductivity. The first SiC buffer layer 331 may have an impurity doping concentration of approximately $5 \times 10^{15}$ to $5 \times 10^{16}$ cm$^{-3}$ and 0.2-0.6 microns thick. The second silicon carbide buffer layer may have an impurity doping concentration between $1 \times 10^{16}$ to $1 \times 10^{17}$ cm$^{-3}$ and ~0.2 microns thick. These buffer layers are formed by epitaxial growth, as described earlier.

As shown in FIG. 3A, the Mesa etch terminates after fully etching through the more heavily doped second SiC buffer layer 332. This allows source 392, drain 393 and gate (not shown) bond pads to terminate on the more lightly doped first SiC buffer layer 331 which results in reduced parasitic capacitance of the MESFET 300 and maintains the high frequency response of MESFET 300. Source 365 and drain 375 electrodes are routed off MESA to form source 392 and drain 393 bonding pads over the more lightly doped buffer layer 331. Gate electrodes (not shown) are also routed off MESA to similarly form gate bond pads. An alternative embodiment of the bi-layer buffer may include a buffer with graded doping that approximates the aforementioned higher doping in buffer region 332 and lighter doping in buffer region 331.

Figure 3B:
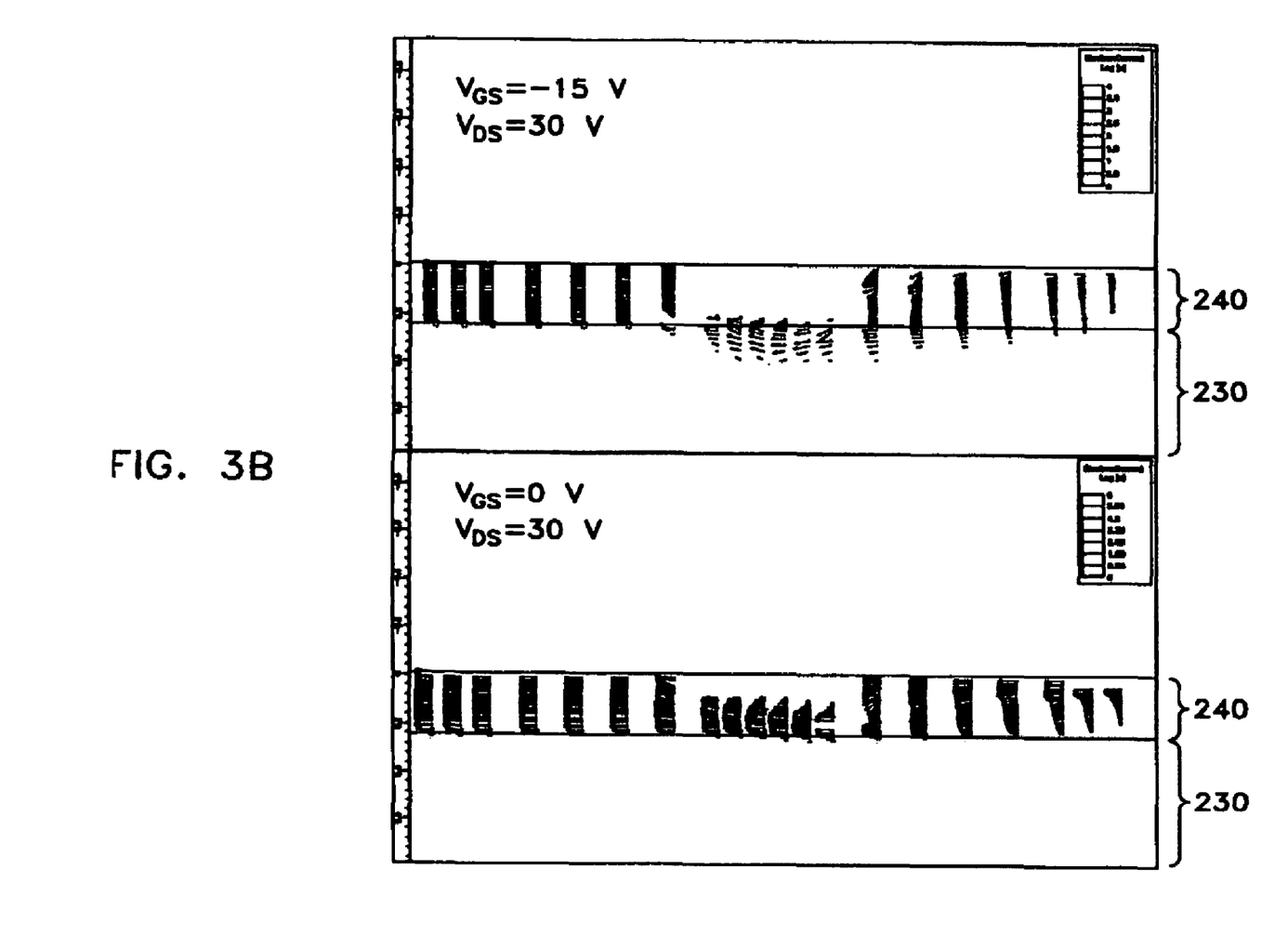
FIG. 3B is a graph illustrating current simulation results for a prior art MESFET having a prior art lightly doped buffer.
Figure 3C:
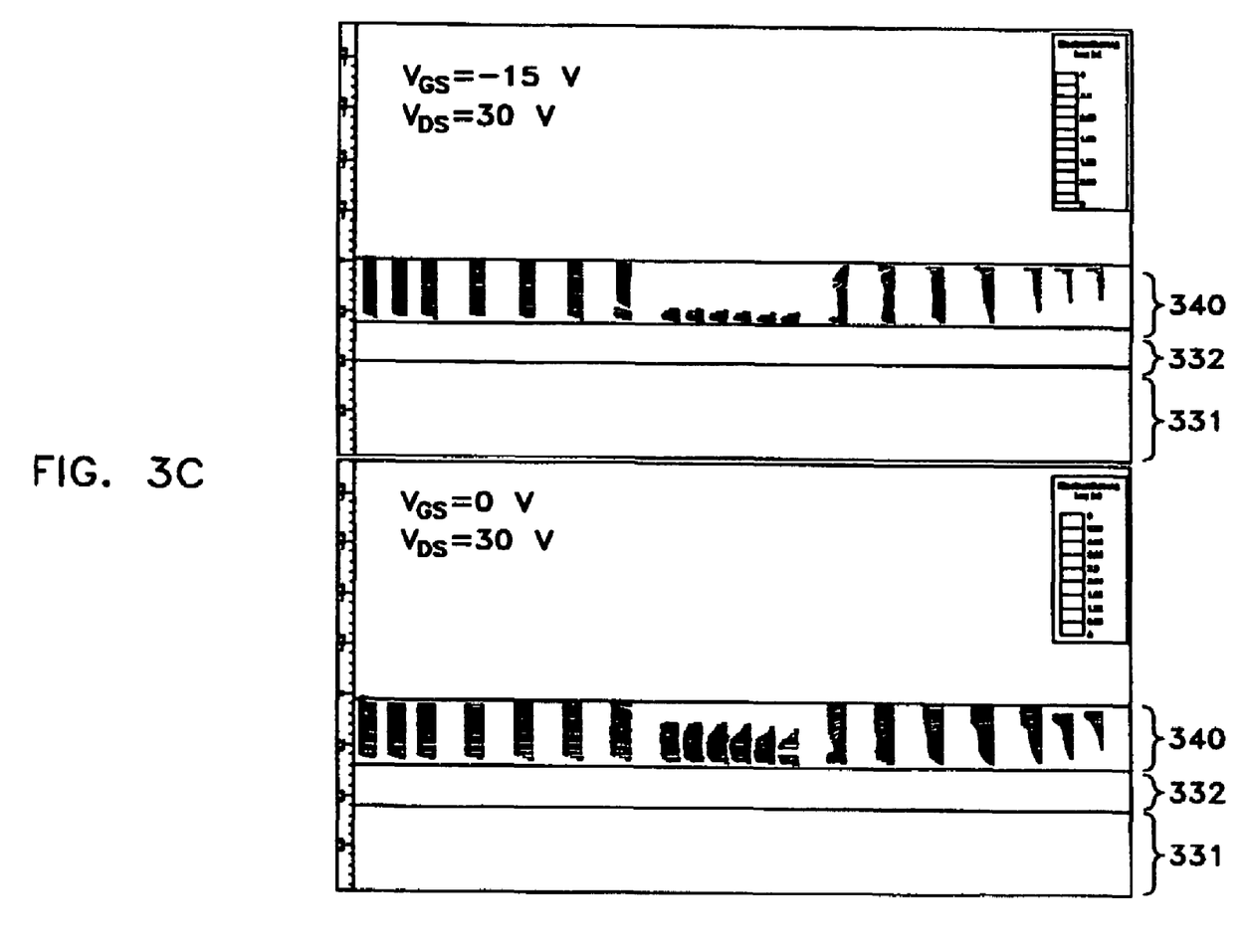
FIG. 3C is a graph illustrating current simulation results for a MESFET having the bi-layer buffer of the present invention.

FIG. 3B presents prior art MESFET 295 (FIG. 2B) current simulation results for the prior art lightly doped buffer that show when biasing voltages $V_{GS}$ and $V_{DS}$ are applied between the gate 280 and drain 275 electrodes (source 265 electrode grounded) channel current extends into the buffer 230 for both pinchoff and full on MESFET biasing. Injected electrons can be trapped and/or recombine in the buffer which reduces channel current and degrades reliability. FIG. 3C (bi-layer buffer invention) presents MESFET 300 (FIG. 3A) simulation results that show when biasing voltages $V_{GS}$ and $V_{DS}$ are applied between the gate 380 and drain 375 (source 365 grounded) channel current is confined to the channel layer 340 for both pinchoff and full on MESFET biasing; therefore, electrons are not injected into the top layer 332 of the bi-layer buffer layer structure and current is not reduced by trapping and recombination in the buffer. The higher doped second SiC buffer layer 332 provides excellent electron confinement in the channel layer 340 that results in improved power performance and reliability.

The MESFET depicted in FIG. 2A may also include the above described bi-layer buffer structure.

Figure 4A:
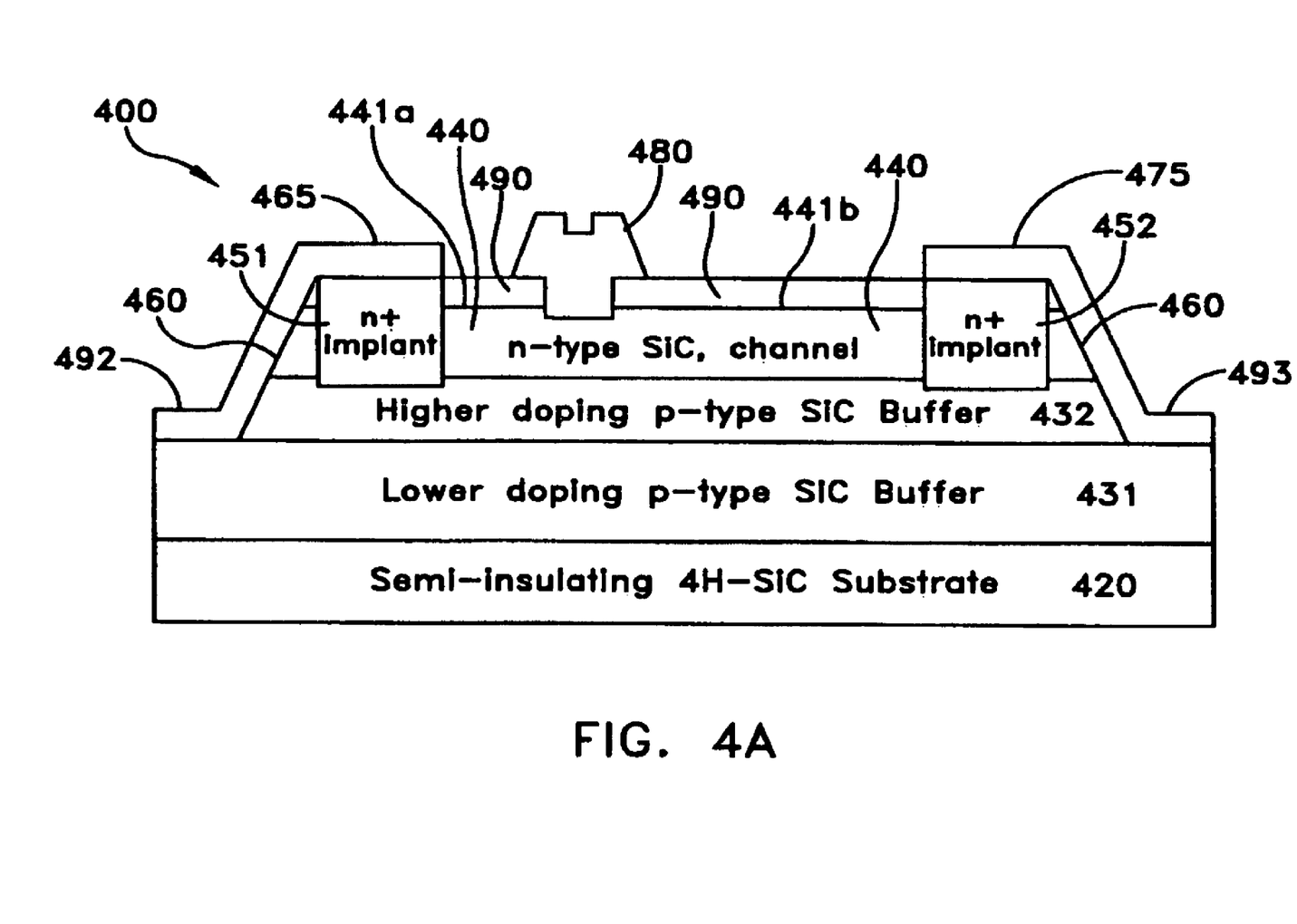
FIG. 4A illustrates a sectional view of still another embodiment of a SiC MESFET according to the present invention having a surface effects suppression layer.

FIG. 4A illustrates a sectional view of a further embodiment of a SiC MESFET according to the present invention, denoted by 400. MESFET 400 illustrated in this embodiment is similar to the MESFET 300 illustrated in FIG. 3A, except that it includes an EPI deposited SiC surface effects suppression layer 490 over channel layer 440 in place of a dielectric passivation. The preferred embodiment of the SiC surface effects suppression layer 490 is 1000 to 2000 Angstroms (A) of lightly doped N-SiC, but may be composed of 1000 to 2000 A of un-doped SiC or lightly doped P-type SiC. SiC surface effects suppression layer 490 is an alternative to dielectric passivation for eliminating channel layer 440 surface effects such interface states and dangling bonds. The layer 490 is deposited as the last step of the EPI fabrication process over the entire wafer surface. The presence of this layer requires adjustments to the previously described MESFET process flow. The MESA 460 etch depth is increased by the thickness of this layer, the source 451/drain 452 implant conditions are modified to insure N+ doping reaches through to the bottom of channel layer 440, and the surface suppression layer is removed under the T-gate electrode 480 to allow Schottky contact to the channel surface 440. Deeper MESA etching is achieved by a longer etch time. Implant conditions are adjusted to insure sufficient implant depth into the channel layer 440 and to insure that the channel suppression layer over the source 451 and drain 452 regions is N+ doped to allow low resistance path to the channel region as well as the formation of low resistance ohmic contacts; specifically the preferred implant conditions are Phosphorous (P31) at 600 C; 300 KeV 2.0E15*doubly charged, 180 KeV 1.3E15, 90 KeV 1.1E15, and 40 KeV 8.0E14. Overlay metalization to form the source electrode 465 and drain electrode 475 is added over the ohmic contact as previously described. Removal of the surface effects suppression layer under the gate is accomplished by a SiC dry etch in the lithographic defined gate openings prior to evaporated gate metal deposition and liftoff. Care must be taken not to impart damage to channel layer surface that will be exposed to the etch chemistry. Appropriate adjustments to the dry etcher power, gas flow and temperature are required. At the completion of processing the channel suppression layer 490 is retained over channel layer surface region 441a extending between the gate electrode 480 and the implanted source region 451, and it is retained over channel surface region 441b extending between the gate electrode 480 and the implanted drain region 452.

Figure 4B:
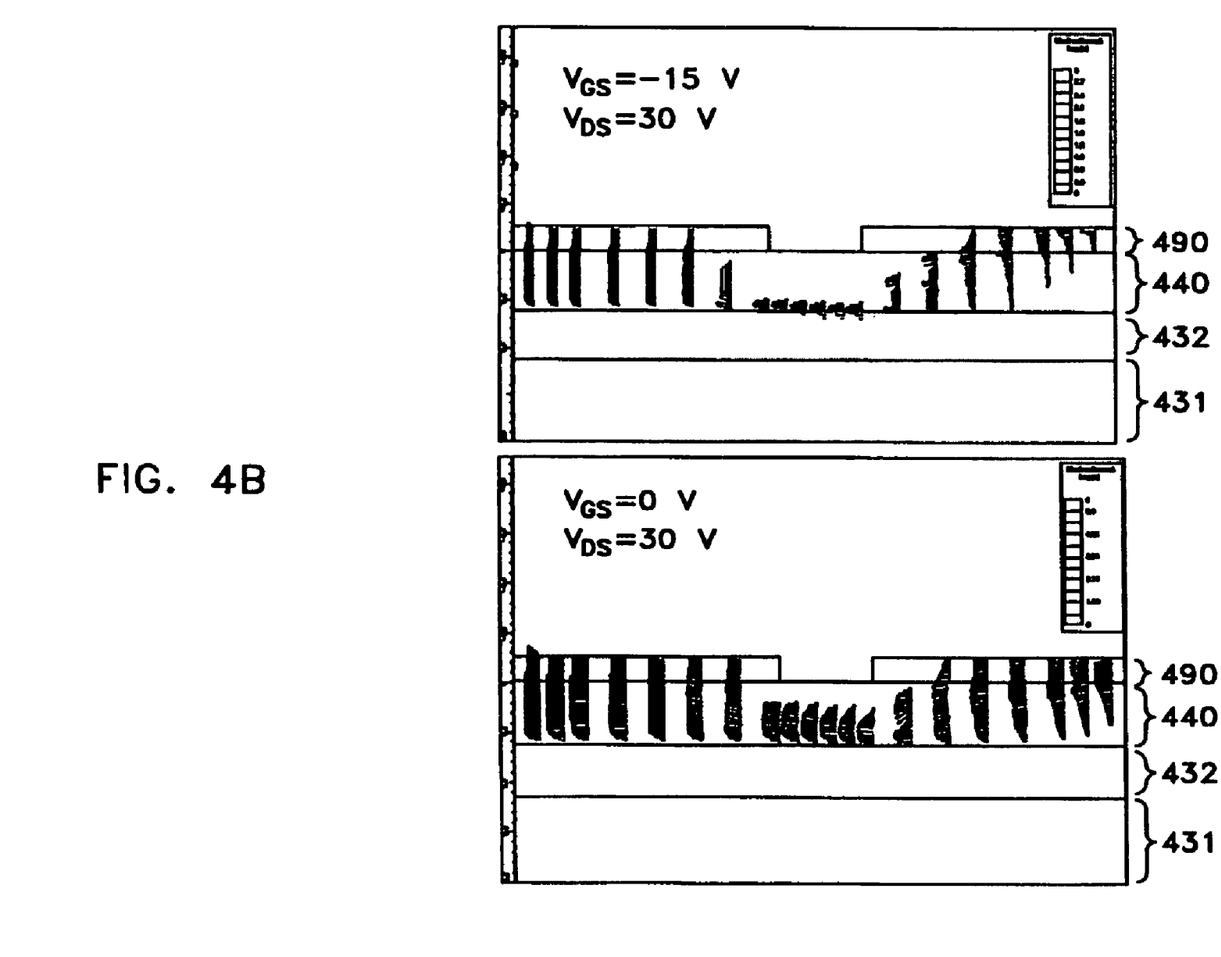
FIG. 4B is a graph illustrating the simulation results for a SiC surface effects suppression layer.

Current flow simulation results in FIG. 4B demonstrate that the surface effects suppression layer 495 prevents the charge carriers in the channel layer 440 from flowing near the outer surface (top of channel suppression layer 490) of MESFET 400 when biasing voltages $V_{GS}$ and $V_{DS}$ are applied between the gate 480 and drain 475 (with the source 465 grounded). Accordingly, electrons will not be trapped by existing defects at top of the SiC (layer 490).

Figure 5A:
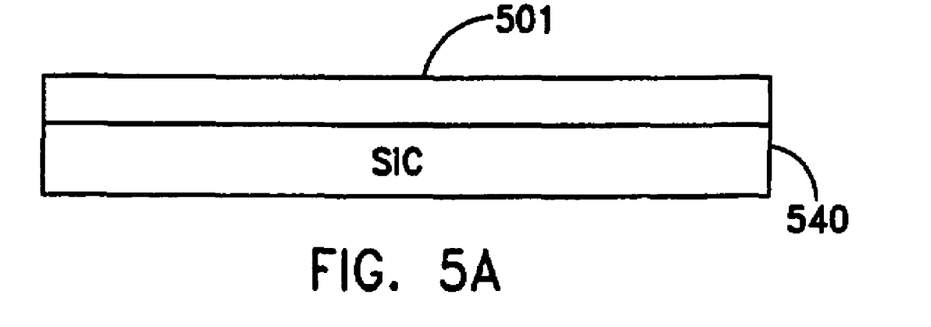
FIGS. 5A-5D are sectional views illustrating an embodiment of a method for fabricating MESAs according to the present invention, to isolate MESFETs from one another.

MESFET devices must be isolated from one another. This is achieved by a lithographic patterning and dry etching to form MESAs 360 as shown, for example, in FIG. 3A. If MESA sidewalls are vertical, it will lower yield due to source, drain and gate interconnect thinning and breaks as metal interconnects traverse over the MESA edge to form off-MESA pad terminations (See elements identified by reference numerals 392 and 393 in FIG. 3A). A novel approach for achieving sloped MESA sidewalls is outlined in FIGS. 5A-5D. A sloped profile is created in the semiconductor by etching with a sloped dielectric material acting as a transfer mask. The method utilizes one or more dielectric films to protect the active device SiC surface region during MESA etching and to eliminate the risk of burning of the photoresist due to heating during MESA etching (0.4-0.8 microns etch depth). In FIG. 5A, one or more dielectric films 501 have been deposited on the SiC top layer 540. The top surface can be a channel layer, N+ cap layer, or surface effects suppression layer. The one or more dielectric films 501 may include $SiO_2$ or SiNx. Either PECVD or LPCVD deposited dielectric layers are preferred and may be proceeded by a thin thermal oxidation followed by a nitrogen anneal.

Figure 5B:
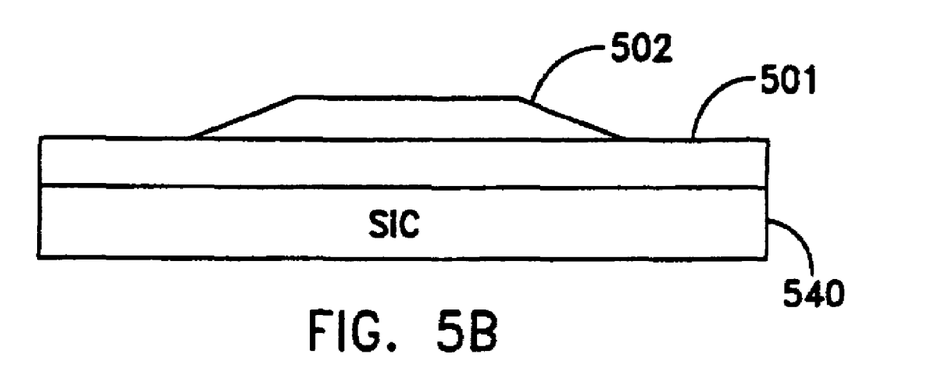
Figure 5C:
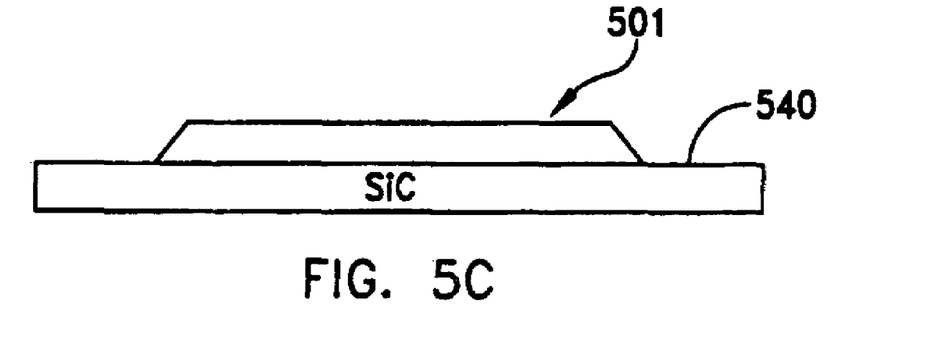
Figure 5D:
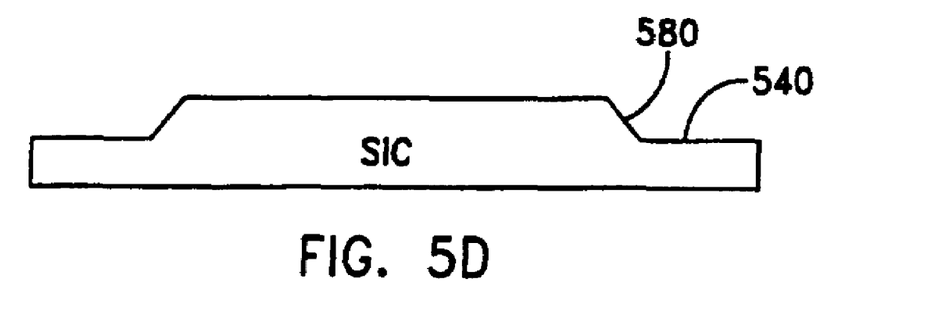

FIG. 5B shows a layer 502 of photoresist patterned to define a MESFET active device MESA region in the dielectric film(s) 501. The sloped profile is formed in the layer 502 of photoresist by reflowing the layer 502 at elevated temperature of approximately 130° C. The one or more dielectric films 501 are dry etched in a $NF_3$/Ar with gas ratios, gas flow, temperature and pressure adjusted to insure controlled resist erosion (etch selectivity ~1:1 resist:oxide) during etching to insure the creation of a sloped profile into the one or more dielectric films 501. Following etching, the resist mask 502 is chemically stripped, as shown in FIG. 5C leaving the one or more dielectric films 501 patterned into a sloped MESA etch mask. The sloped one or more dielectric films 501 have a controlled erosion during the subsequent SiC dry etch, which is typically performed in an RIE (Reactive Ion Etch) dry etch system with $NF_3/O_2$ the preferred etch gases. The SiC dry etch gas ratios, gas flow, temperature and pressure are adjusted to insure controlled resist erosion (etch selectivity ~1:1 oxide:SiC) during etching to insure the creation of a sloped MESA profile. Once the etch depth desired has been reached the mask formed by the one or more dielectric films 501 is removed with a buffered HF dip. The resulting MESA structure 580 in the SiC layer 540 is shown in FIG. 5D. The nominal slope of the MESA structure 580 may be 60 degrees and slopes between 45 and 80 degrees may be obtained with this technique. This process also eliminates bottom edge field crowding during dry etching which prevents the etch rate from increasing at MESA edges. The sloped MESA improves device yield by improving gate, source, and drain interconnect integrity over MESA steps and results in improved long term reliability. Another advantage of this process is that wafer temperature can be significantly increased during MESA etching because there is no photo resist present during the SiC MESA etch step. An alternative to this process is an all resist process in an ICP (Inductively Coupled Plasma) system with wafer cooling that insures resist is not "fried" during etching. The preferred etch chemistry for this process is SF6 with gas ratios, gas flow, temperature and pressure adjusted to insure controlled resist erosion. The nominal result for this process is a 60 degree MESA sidewall slope. All MESFET structures must be MESA isolated which requires the etch depth extend through the active channel layer and into the buffer layer.

While the foregoing invention has been described with reference to the above, various modifications and changes can be made without departing from the spirit of the invention. Accordingly, all such modifications and changes are considered to be within the scope of the appended claims.

What is claimed is:

1. A method of fabricating a metal semiconductor field-effect transistor with a sloped MESA structure, the method comprising the steps of:
    forming at least one layer of dielectric material on a layer of semiconductor material which will form an active region of the transistor;
    creating a sloped profile in the at least one layer of dielectric material; and
    etching the layer of semiconductor material using the at least one layer of dielectric material having the sloped profile as an etch mask, with controlled erosion of the etch mask simultaneous with the etching of the layer of semiconductor material to transfer the sloped profile to the layer of semiconductor material and define a MESA having sloped profiles.

2. The method according to claim 1, further comprising the step of, after the step of etching, removing the at least one layer of dielectric material from the layer of semiconductor material.

3. The method according to claim 1, wherein the at least one layer of dielectric material is selected from the group consisting of $SiO_2$, $SiN_x$, and combinations thereof.

4. The method according to claim 1, wherein the step of creating a sloped profile in the at least one layer of dielectric material comprises the steps of: forming a resist mask on the at least one layer of dielectric material; and reflowing the resist to define a sloped profile in the resist mask.

5. The method according to claim 4, wherein the step of creating a sloped profile in the at least one layer of dielectric material further comprises the step of etching the at least one layer of dielectric material, with controlled erosion of the resist mask simultaneous with the etching of the at least one layer of dielectric material to transfer the sloped profile from the resist mask to the at least one layer of dielectric material.

6. The method according to claim 5, further comprising the step of removing the resist mask after creating a sloped profile in the at least one layer of dielectric material and before etching the semiconductor material.

7. The method according to claim 5, wherein an etch selectivity of about 1:1 for the resist to the dielectric material is employed.

8. The method according to claim 1, wherein the layer of semiconductor material comprises SiC.

9. The method according to claim 1, wherein the slope of the sloped profile in the at least one dielectric layer is between 45 and 80 degrees.

10. The method according to claim 1, wherein an etch selectivity of about 1:1 for the dielectric material to the semiconductor material is employed.

11. A method of fabricating a metal semiconductor field-effect transistor with a sloped MESA structure, the method comprising the steps of:
    forming at least one layer of dielectric material selected from the group consisting of $SiO_2$, $SiN_x$ and combinations thereof, on a layer of semiconductor material of SiC which will form an active region of the transistor;
    etching the at least one layer of dielectric material to define a patterned etch mask having a sloped profile on opposing edges thereof;
    etching the layer of semiconductor material with simultaneous controlled erosion of the etch mask to transfer the sloped profiles of the etch mask to the semiconductor material to define a MESA having opposing sloped profiles.

12. The method according to claim 11, further comprising, prior to the step of etching the at least one layer of dielectric material, forming a resist mask on the at least one layer of dielectric material; and reflowing the resist to define a sloped profile on opposing edges of the resist mask.

13. The method according to claim 12, wherein the step of etching the at least one layer of dielectric material comprises controlled erosion of the resist mask simultaneous with the etching of the at least one layer of dielectric material to transfer the sloped profile of the resist mask to the dielectric material.

14. The method according to claim 13, further comprising the step of removing the resist mask after etching the at least one layer of dielectric material and before etching the semiconductor material.

15. The method according to claim 14, wherein the step of etching the semiconductor material is performed in a reactive ion etch dry etch system.

16. The method according to claim 13, wherein an etch selectivity of about 1:1 for the resist to the dielectric material is employed.

17. The method according to claim 16, wherein an etch selectivity of about 1:1 for the dielectric material to the semiconductor material is employed.

* * * * *